(12) United States Patent
Chae et al.

(10) Patent No.: US 7,954,035 B2
(45) Date of Patent: May 31, 2011

(54) LOW DENSITY PARITY CHECK ENCODER USING COSTAS ARRAY, AND CHANNEL ENCODER OF HIGH SPEED PORTABLE INTERNET SYSTEM COMPRISING THE SAME AND CHANNEL ENCODING METHOD

(75) Inventors: Su-Chang Chae, Daejeon (KR); Youn-Ok Park, Daejeon (KR)

(73) Assignees: Electronics and Telecommunications Research Institute, Daejeon (KR); Samsung Electronics Co., Ltd., Suwon-si (KR); KT Corporation, Seongnam (KR); SK Telecom Co., Ltd, Seoul (KR); Ktfreetel Co., Ltd., Seoul (KR); Hanaro Telecom, Inc., Seoul (KR)

( * ) Notice: Subject to any disclaimer, the term of this patent is extended or adjusted under 35 U.S.C. 154(b) by 793 days.

(21) Appl. No.: 11/722,214

(22) PCT Filed: Mar. 25, 2005

(86) PCT No.: PCT/KR2005/000890
§ 371 (c)(1),
(2), (4) Date: Jan. 29, 2008

(87) PCT Pub. No.: WO2006/068348
PCT Pub. Date: Jun. 29, 2006

(65) Prior Publication Data
US 2008/0141098 A1   Jun. 12, 2008

(30) Foreign Application Priority Data

Dec. 21, 2004  (KR) .................. 10-2004-0109423

(51) Int. Cl.
*H03M 13/00* (2006.01)
(52) U.S. Cl. .................. 714/758; 714/793; 714/800
(58) Field of Classification Search .................. 714/758, 714/793, 794, 796, 800, 803, 804, 805
See application file for complete search history.

(56) References Cited

U.S. PATENT DOCUMENTS

| 7,222,289 | B2 * | 5/2007 | Hung ............................. 714/807 |
| 7,409,001 | B2 * | 8/2008 | Ionescu et al. ................ 375/267 |
| 7,653,867 | B2 * | 1/2010 | Stankovic et al. ............ 714/785 |
| 7,779,326 | B2 * | 8/2010 | Stankovic et al. ............ 714/752 |

FOREIGN PATENT DOCUMENTS

| KR | 10-2004-0044590 A | 5/2004 |
| WO | WO 2004/047019 A2 | 6/2004 |

OTHER PUBLICATIONS

Low Complexity Encoding of Improved Regular LDPC Codes, Chae et al., 0-7803-8521—Jul. 2004 IEEE 2004.

(Continued)

*Primary Examiner* — Fritz Alphonse
(74) *Attorney, Agent, or Firm* — Jefferson IP Law, LLP

(57) ABSTRACT

The present invention provides an LDPC encoder, a channel encoder of a portable internet system including the LDPC encoder, and an encoding method thereof. The LDPC encoder according to the present invention generates a Costas array, shifts it, generates an analogous circulation parity check matrix having a repeated pattern from the shifted Costas array, and performs encoding by using the parity check matrix. With this LDPC encoder, complexity of encoding system may be reduced.

9 Claims, 5 Drawing Sheets

OTHER PUBLICATIONS

Low complexity Encoding of Regular Low density Parity Check codes, Chae et al., 0-7803-7954—Mar. 2003 IEEE 2003.

Joint code and decoder design for implementation-oriented (3, k)-regular LDPC codes, Tong Zhang and Keshab K. Parhi, Proc. of IEEE Asilomar Conference, Nov. 2001, IEEE 2001.

Constructions and Properties of Costas Arrays, Solomon W. Golomb, fellow, IEEE and Herbert Taylor, Proc. of IEEE, vol. 72, No. 9, Sep. 1984.

Low-Density Parity-Check (LDPC) Coded OFDM Systems, Hisashi Futaki et al., 0-7803-7005—Aug. 2001 IEEE 2001.

* cited by examiner

[FIG. 2]
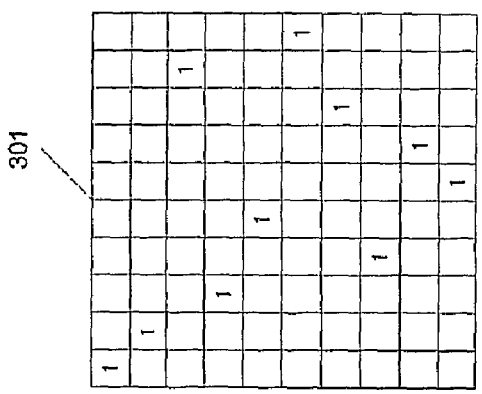
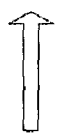
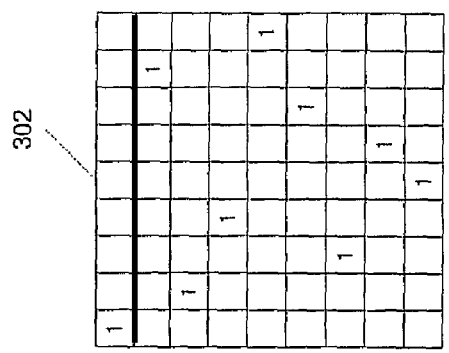
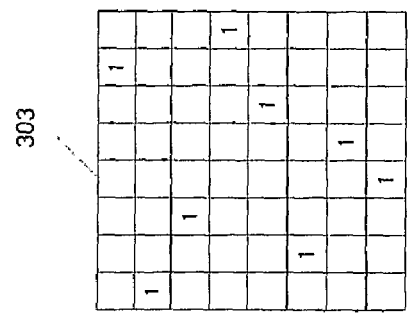

[FIG. 3]
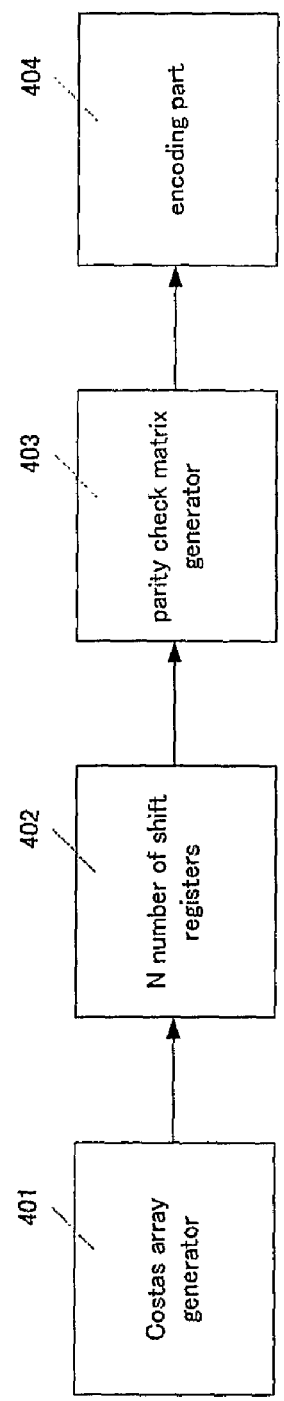

[FIG. 4]
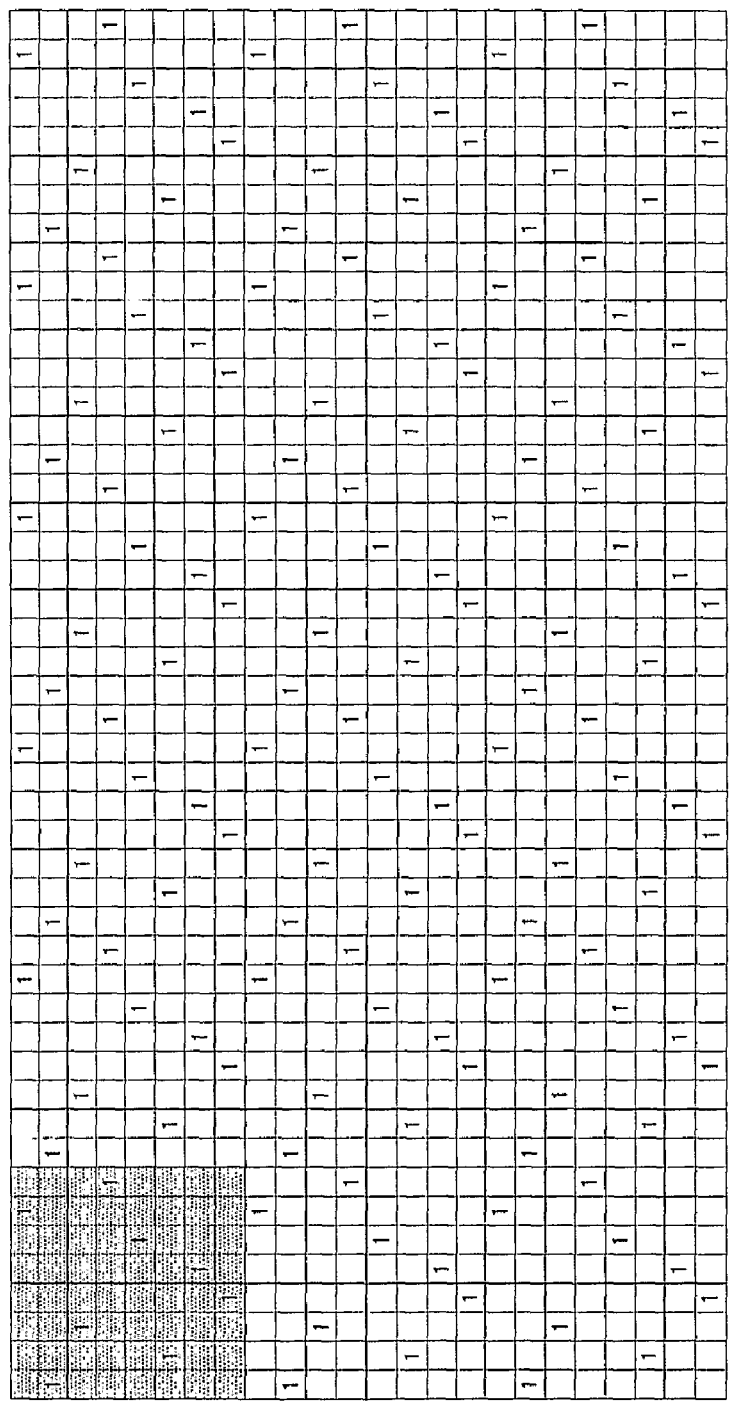

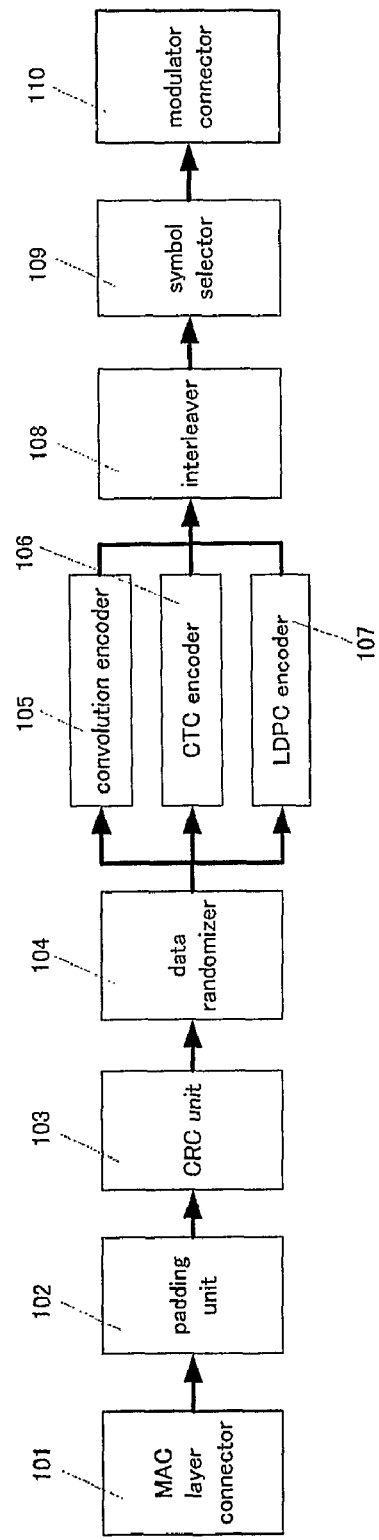
[FIG. 5]

LOW DENSITY PARITY CHECK ENCODER USING COSTAS ARRAY, AND CHANNEL ENCODER OF HIGH SPEED PORTABLE INTERNET SYSTEM COMPRISING THE SAME AND CHANNEL ENCODING METHOD

TECHNICAL FIELD

The present invention relates to a channel encoder in a portable Internet system. More particularly, the present invention relates to an encoder using a low density parity check (LDPC) code and a channel encoder including the encoder in the portable Internet system.

BACKGROUND ART

In next-generation multi media mobile communication which is recently being researched and developed briskly, it is necessary to integrate various systems such as an individual mobile phone, a radio pager, a mobile data, a satellite communication, and etc., and thereby to provide an international roaming which enables users to communicate with whoever, wherever, and whenever. In addition, it is aimed to provide a multiple information service in which voice, data, image, and etc., are integrated.

In order to provide a multi media communication service in mobile communication, a high speed transmission and various type of data transmission are needed, so it is essential to increase an efficiency of a system by using different encoding schemes according to types of channel and data.

Meanwhile, when transmitting data, a portable Internet system uses a 2.3 GHz bandwidth, adopts an orthogonal frequency division multiplexing access (OFDMA) scheme, and uses a time division duplex (TDD) scheme in switching an uplink and a downlink during 5 ms. The downlink has a packet length of 24,000 bit, which is a rather long data packet length. In order to efficiently perform a channel decoding for such a long data length, a LDPC coding scheme is advantageous.

In the 1960's, Gallager invented the LDPC code for an LDPC encoder. The LDPC code shows better performance than the conventional turbo code. According to the LDPC code, complexity of a decoder is low, a parallel operation and a high speed process are possible, and an iterative decoding scheme may be applied like in a turbo decoder. So, it is appropriate for the mobile communication system in which a low error rate and a high speed data process are required.

According to the international standard IEEE802.16e, a convolutional turbo code (CTC) encoder is basically used for a channel coding, and a LDPC encoder is alternatively used, so that it may complement the performance. Korean Patent Publication No. 2004-0044590 discloses about the LDPC encoder. However, hardware of the LDPC encoder is generally more complex than that of the CTC encoder. High complexity of an encoder of LDPC code causes a difficulty in embodying the encoder.

LDPC code has two kinds of H matrix that function as a parity check matrix. Among the two kinds of H matrix, one is a matrix which has binary elements, and the other has non-binary elements.

The H matrix formed of non-binary elements shows better performance than that of binary elements, but it has drawbacks in that a Galois field operation is complicated. On the other hand, the LDPC code of which the H matrix has binary elements (i.e., 0 or 1) may be divided into a regular LDPC code of which rows have equivalent weights and an irregular LDPC code of which rows have non equivalent weights.

In the regular LDPC code, it is not easy to generate a H matrix due to a limitation in making weights of rows be equivalent. On the contrary, in the irregular LDPC code, the weights of rows in the H matrix are not constant, therefore the irregular LDPC code has a merit in easily generating a H matrix formed of high girth (minimum cycle without 4-cycle) determining decoding performance. The irregular LDPC code generally shows better performance than the regular LDPC code. However, it has drawbacks in that the complexity of an LDPC encoder and a decoder which need to have image information of the H matrix is increased.

The above information disclosed in this Background section is only for enhancement of understanding of the background of the invention and therefore, it may contain information that does not form the prior art that is already known in this country to a person or ordinary skill in the art.

DISCLOSURE

Technical Problem

The present invention has been made in an effort to provide an LDPC encoder, a channel encoder of a portable Internet system including the LDPC encoder, and an encoding method thereof. The advantage of the present invention is to provide a structure of a channel encoder appropriate for a portable Internet system terminal by using an LDPC encoder having excellent encoding performance for a downlink packet, while maintaining compatibility with the international standard IEEE 802.16e.

Technical Solution

The present invention has been made in an effort to provide an LDPC encoder, a channel encoder of a portable Internet system including the LDPC encoder, and an encoding method thereof having advantages of providing a parity check matrix having low complexity and improved performance efficiency. An exemplary low density parity check code (LDPC) encoder using LDPC according to an embodiment of the present invention includes a Costas array generator, at least two shift registers, a parity check matrix generator, and an encoding part. The Costas array generator generates an n×n Costas array of n dots having one dot in every row and column. Here, n is a natural number. The shift registers shifts the Costas array generated by the Costas array generator. The parity check matrix generator generates an analogous circulation parity check matrix, in which the same data pattern is repeated, from the shifted data. The encoding part performs encoding by using the parity check matrix generated by the parity check matrix generator.

An exemplary channel encoder of a portable Internet system according to an embodiment of the present invention includes a MAC layer connector, a padding unit, a CRC unit, an encoder, and an interleaver. The MAC layer connector performs a connection with a MAC layer. The padding unit receives data from the MAC layer and pads the received data to be fitted to a code block length. The CRC unit adds a CRC bit to the padded data. The encoder encodes the CRC bit added data. The interleaver channel-interleaves the encoded data.

Here, the encoder encodes by selectively using any one of a convolution encoder, a turbo encoder, and an LDPC encoder. The LDPC encoder encodes by using an analogous circulation parity check matrix generated on the basis of a Costas array.

An exemplary channel encoding method of a portable Internet system according to an embodiment of the present invention includes: generating a n×n Costas array of n dots having one dot in every row and column, wherein n is a natural number; generating an analogous circulation parity check matrix having a repeated same data pattern by shifting the generated Costas array at least twice; and encoding by using the generated parity check matrix.

An embodiment of the present invention will hereinafter be described in detail with reference to the accompanying drawings. In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

The present invention provides an H matrix generating method by using the regular LDPC code. The method shows a performance almost equal to that of an irregular LDPC code. In addition the present invention provides a method of embodying an LDPC encoder.

There are two kinds of coding method in LDPC code. The one is a coding method using a generator matrix G, and the other is a coding method using the parity check matrix H. According to the coding method using the generator matrix G, the H matrix needs to be calculated first, and then the H matrix is converted into the G matrix. The G matrix can be calculated by the Gauss-Jordan Elimination method, but it is disadvantageous to realize this method with hardware or software, because its operation process is very irregular and heavy, and takes too much time to calculate.

Therefore, in an exemplary embodiment of the present invention, a method and a device for performing an encoding process without calculating the G matrix but using the parity check matrix H will be described. A process for coding by using the parity check matrix H is as shown below.

Generally, a given code word u and a (M×N) parity check matrix H fulfill Equation 1 below.

$$u \cdot H^T = 0 \quad \text{[Equation 1]}$$

When it is assumed that a message bit s is placed in the right side of the code word u, and a parity check bit c is placed in the left side of the code word u, the code word u may be expressed as Equation 2 below.

$$u = [c|s] \quad \text{[Equation 2]}$$

Then, the parity check matrix H may be given as Equation 3 below.

$$H = [A|B] \quad \text{[Equation 3]}$$

In Equation 3, A is a (M×M) matrix, B is a {M×(N−M)} matrix. The A matrix, which is the left side of the H matrix, is an identity matrix.

Equation 1 may be expressed as Equation 4 below by using Equations 2 and 3.

$$Ac + Bs = 0 \quad \text{[Equation 4]}$$

Therefore, the parity check bit c may be expressed as Equation 5 below.

$$c = A^{-1}Bs \quad \text{[Equation 5]}$$

A matrix needs to be a non-singular matrix to calculate the parity check bit C. Since the two matrices obtained by column permutation are equivalent to each other, when the A matrix is not a non-singular matrix, c can be obtained by column permutation after calculating a temporary parity check bit c'.

FIG. 1 illustrates a coding scheme by generating a H matrix of Gallager.

As shown in FIG. 1, according to the H matrix generating scheme of Gallager, a first sub-matrix like a matrix 102 is constructed by using a matrix 101. The first sub-matrix forms (j−1)k+1∼i*k columns of i-th rows. Here, j is a column weight, and k is a row weight, and j and k are both 6. Next, a second sub-matrix and a third sub-matrix are generated by permutating the first sub-matrix as matrixes 103 and 104.

However, a sub-matrix used in generating the H matrix has no circularity, and a performance of the H matrix depends on a randomness of the permutation rule. So, performance analysis of the H matrix generated by such a scheme is very difficult. Therefore, it is difficult for the H matrix to assure a parity check matrix in which 4-Cycle is eliminated completely, or a parity check matrix having high-girth.

The present invention provides a method for decreasing a complexity of performance analysis and realization of the H matrix to overcome such drawbacks mentioned above. According to the method, the H matrix is generated by circularly repeating a sub-matrix by the shift register, and the sub-matrix uses a Costas array.

In the parity check matrix using Costas array according to an exemplary embodiment of the present invention, the sub-matrix is constructed by using a Costas array having fine randomness. In other words, since the parity check matrix using Costas array constructs a matrix by using the shift register, complexity of the LDPC encoder may be reduced sharply.

A Costas array is an n×n pattern of n dots having only one dot (dot '1') in every row and column. According to Welch's constructing method, a Costas array of N=p−1 may be constructed as below for a prime number p.

First, a prime number α of Galois field GF(p) is chosen. A dot is put in a cell (i, j) of the n×n array fulfilling Equation 6.

$$i = \alpha^j (\bmod p) \quad 1 \leq i \leq n,\; 0 \leq j \leq n-1 \quad \text{[Equation 6]}$$

Next, the uppermost row and left side column are eliminated, and then a modification matrix is obtained according to Welch's construction method.

FIG. 2 shows an exemplary embodiment of the present invention for a constructing method of a Costas array. Here, 202 and 203 indicate a modification matrix of Welch for p=11, α=2, α$^j$(mod 11)={1,2,4,8,5,10,9,7,3,6}.

An analogous circulation parity check matrix Hc using a Costas array according to an exemplary embodiment of the present invention is given to be as below.

$$H_c = \begin{bmatrix} C_{\alpha 1}(0) & C_{\alpha 1}(0) & \cdots & C_{\alpha 1}(0) \\ C_{\alpha 2}(0) & C_{\alpha 2}(p_{1,1}) & \cdots & C_{\alpha 2}(p_{1,L-1}) \\ \vdots & \vdots & \ddots & \vdots \\ C_{\alpha J}(0) & C_{\alpha J}(p_{J-1,1}) & \cdots & C_{\alpha J}(p_{J-1,L-1}) \end{bmatrix},$$

Here, $C_{\alpha J}(J)$ is a Costas array of which a row is shifted by being selected by primitive elements α, $P_{J,L}$ in order to have a high-girth, and a minimum distance.

FIG. 3 is a block diagram showing a structure of an LDPC encoder using a Costas array generating device according to an exemplary embodiment of the present invention As shown in FIG. 3, an LDPC encoding device according to an exemplary embodiment of the present invention includes a Costas array generator 301, N number of shift registers 302, a parity check matrix generator 303, and an encoding part 304.

The Costas array generator 301 generates a Costas array, the generated Costas array is shifted through the N number of the shift registers 302, the parity check matrix generator 303 generates a parity check matrix, and finally the encoding part 304 performs encoding.

FIG. 4 shows the parity check matrix obtained through an 8×8 Costas array constructed by the Welch's constructing scheme in FIG. 2. In the parity check matrix, the Costas array according to an exemplary embodiment of the present invention is used as a basic element, and the shifting step in FIG. 3 is omitted.

According to an exemplary embodiment of the present invention, to obtain the parity check matrix Hc using the Costas array of (N,3,6) regular LDPC, p is 8 and weight is 6 (p=8, weight=6), therefore the process will be repeated six times (L=6), then N=48. Also, M is 24, because column weight is 3 (column weight=3, M=24).

A minimum distance of the parity check matrix Hc constructed by using the Costas array according to an exemplary embodiment of the present invention is given to be as Equation 7, and a maximum girth is 24.

$$d_{min} \leq (d_c+1)!$$ [equation 7]

The parity check matrix Hc using the Costas array according to an exemplary embodiment of the present invention has an improved BER performance by 0.5 dB than the parity check matrix of Gallager. In addition, according to an exemplary embodiment of the present, complexity of the encoder is reduced compared to that in the Gallager's scheme, because of the analogous circulation LDPC code using a shift register.

FIG. 5 shows a structure of a channel encoder of a portable Internet system terminal using the LDPC encoder according to an exemplary embodiment of the present invention.

As shown in FIG. 5, the channel encoder of the portable Internet system terminal according to an exemplary embodiment of the present invention includes a MAC layer connector 501, a padding unit 502, a CRC unit 503, a data randomizer 504, a convolution encoder 505, a CTC encoder 506, an LDPC encoder 507, an interleaver 508, a symbol selector 509, and a modulator connector 510.

The MAC layer connector 501 performs a connection with MAC layer, the padding unit 502 receives data from the MAC layer, and pads the data to be fitted with a code block length, and the CRC unit 503 adds a CRC bit to the data. The data randomizer 504 randomize the CRC bit added data, the convolution encoder 505, the CTC encoder 506, and the LDPC encoder 507 encode the randomized data. The interleaver 508 performs a channel interleaving of the data, the symbol selector 509 enables to support a HARQ (Hybrid Automatic Request, Hybrid Automatic Repeat Request) service. The modulator connector 510 performs connection with a modulator.

As described above, since the channel encoder of the portable Internet system terminal according to an exemplary embodiment of the present invention includes the LDPC encoder 507, an encoding process is performed by selectively using the convolution encoder 505, the CTC encoder 506, and the LDPC encoder 507.

The drawings and the detailed description are not restrictive but illustrative of the present invention. While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

INDUSTRIAL APPLICABILITY

According to the present invention, when channel encoding for data having a long packet length of about 24,000 bit in the portable Internet modem, the LDPC encoder using Costas array can be used, so that a parity check matrix having low complexity and improved performance may be efficiently generated.

In addition, the LDPC encoder according to the present invention can iteratively generate the parity check matrix with the shift register and the n×n Costas array generator.

DESCRIPTION OF DRAWINGS

FIG. 2 illustrates a modification method of a Costas array according to an exemplary embodiment of the present invention.

FIG. 3 is a block diagram showing a structure of an LDPC encoder using a Costas array generating device according to an exemplary embodiment of the present invention.

FIG. 4 shows a format of a parity check matrix using an 8×8 Costas array according to an exemplary embodiment of the present invention.

FIG. 5 is a block diagram showing a structure of a terminal channel encoder of a portable Internet system according to an exemplary embodiment of the present invention.

Figure 1:
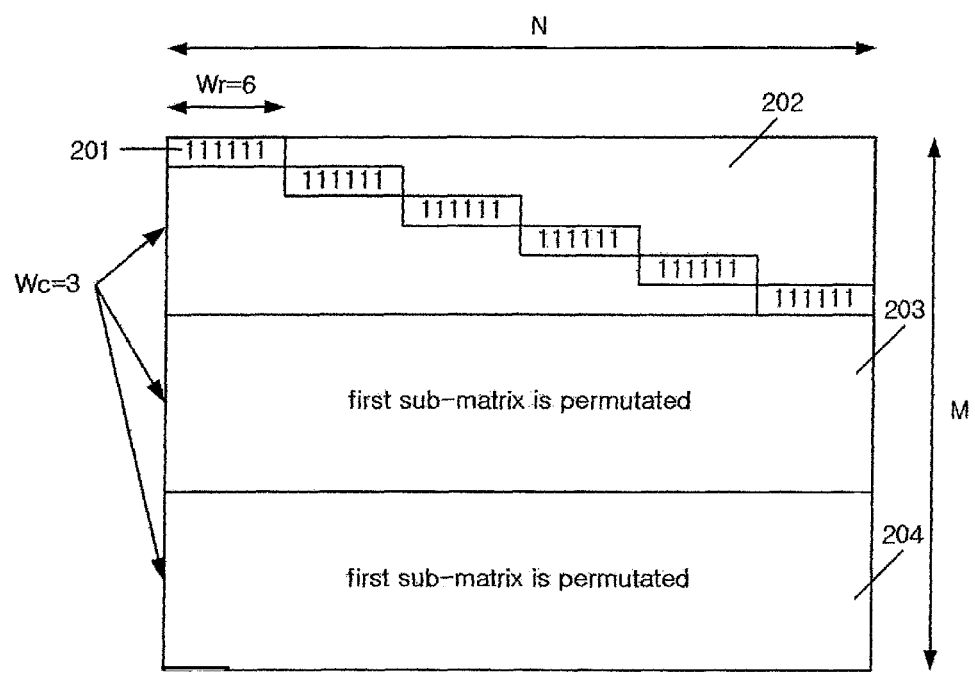
FIG. 1 illustrates a method of generating a parity check matrix of Gallager.

The invention claimed is:

1. A Low Density Parity Check code (LDPC) encoder using LDPC comprising:
    a Costas array generator for generating an n×n Costas array of n dots having one dot in every row and column, wherein n is a natural number;
    at least two shift registers for shifting the Costas array generated by the Costas array generator;
    a parity check matrix generator for generating an analogous circulation parity check matrix, in which a same data pattern is repeated, from the shifted data; and
    an encoding part for performing encoding by using the parity check matrix generated by the parity check matrix generator.

2. The LDPC encoder of claim 1, wherein the Costas array generator generates the Costas array by selecting prime number α of Galois field GF(p) for a prime number p, and inserting a dot in a cell (i,j) of the n×n array fulfilling the following equation below:

$$i = \alpha^j (\bmod\ p)\ 1 \leq i \leq n-1,\ 0 \leq j \leq n-1.$$

3. The LDPC encoder of claim 1, wherein the Costas array generator modifies the Costas array according to a variable input length.

4. The LDPC encoder of claim 1, wherein the LPDC is constructed with binary elements, and is a regular LDPC of which row and column weights are the same with each other.

5. A channel encoder of a portable Internet system comprising:
    a Media Access Control (MAC) layer connector for performing a connection with a MAC layer;
    a padding unit for receiving data from the MAC layer and padding the received data to be fitted to a code block length;
    a Cyclic Redundancy Check (CRC) unit for adding a CRC bit to the padded data;

an encoder for encoding the CRC bit added data; and
an interleaver for channel-interleaving the encoded data,
wherein the encoder encodes by selectively using any one of a convolution encoder, a turbo encoder, and a Low Density Parity Check code (LDPC) encoder, wherein the LDPC encoder encodes by using an analogous circulation parity check matrix generated on the basis of a Costas array.

6. The channel encoder of claim 5, wherein the LDPC encoder comprises:
a Costas array generator for generating an n×n Costas array of n dots having one dot in every row and column, wherein n is a natural number;
at least one shift register for shifting the Costas array generated by the Costas array generator;
a parity check matrix generator for generating an analogous circulation parity check matrix, in which a same data pattern is repeated, from the shifted data; and
an encoding part for performing encoding by using the parity check matrix generated by the parity check matrix generator.

7. The channel encoder of claim 5 further comprising a symbol selector for enabling support of a hybrid automatic request and a Hybrid Automatic Repeat Request (HARQ) service by selecting a symbol.

8. A channel encoding method of a portable Internet system, the method comprising:
generating, by a Costas array generator, an n×n Costas array of n dots having one dot in every row and column, wherein n is a natural number;
generating, by a parity check matrix generator, an analogous circulation parity check matrix having a repeated same data pattern by shifting the generated Costas array at least twice; and
performing, by an encoding part, an encoding by using the generated parity check matrix.

9. The channel encoding method of claim 8, wherein the generating of the n×n Costas array comprises:
selecting a prime number $\alpha$ of Galois field GF(p) for a prime number p;
generating the Costas array by inserting a dot in a cell (i,j) of the n×n array fulfilling an equation $i=\alpha^j \pmod{p}$ $1 \leq i \leq n-1$, $0 \leq j \leq n-1$; and
modifying the Costas array according to a variable input length.

* * * * *